US008889483B2

(12) United States Patent
Yamato

(10) Patent No.: US 8,889,483 B2
(45) Date of Patent: Nov. 18, 2014

(54) METHOD OF MANUFACTURING SEMICONDUCTOR DEVICE INCLUDING FILLING GAP BETWEEN SUBSTRATES WITH MOLD RESIN

(75) Inventor: Masahito Yamato, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 88 days.

(21) Appl. No.: 13/297,668

(22) Filed: Nov. 16, 2011

(65) Prior Publication Data

US 2012/0135565 A1 May 31, 2012

(30) Foreign Application Priority Data

Nov. 29, 2010 (JP) ................................ 2010-265247

(51) Int. Cl.

| | |
|---|---|
| ***H01L 21/50*** | (2006.01) |
| ***H01L 21/56*** | (2006.01) |
| ***H01L 25/065*** | (2006.01) |
| ***H01L 23/00*** | (2006.01) |
| ***H01L 23/31*** | (2006.01) |

(52) U.S. Cl.

CPC ..... *H01L 21/563* (2013.01); *H01L 2224/45147* (2013.01); *H01L 2924/01015* (2013.01); *H01L 2224/32145* (2013.01); *H01L 2224/16225* (2013.01); *H01L 2224/32225* (2013.01); *H01L 25/0657* (2013.01); *H01L 24/27* (2013.01); *H01L 23/3128* (2013.01); *H01L 24/83* (2013.01); *H01L 2924/00014* (2013.01); *H01L 2225/06586* (2013.01); *H01L 2224/45144* (2013.01); *H01L 21/568* (2013.01); *H01L 24/97* (2013.01); *H01L 2225/06544* (2013.01); *H01L 2224/16145* (2013.01); *H01L 2224/83192* (2013.01); *H01L 2924/01029* (2013.01); *H01L 21/561* (2013.01); *H01L 2224/97* (2013.01); *H01L 24/75* (2013.01); *H01L 23/3135* (2013.01); *H01L 24/81* (2013.01); *H01L 21/565* (2013.01); *H01L 2924/15311* (2013.01); *H01L 2224/73204* (2013.01); *H01L 2225/06513* (2013.01)

USPC ........... 438/107; 257/621; 257/686; 257/774; 257/E23.174; 257/E21.499; 257/E21.503; 438/126

(58) Field of Classification Search

USPC .......... 257/621, 686, 774, E23.174, E21.499, 257/E21.503; 438/107, 126

See application file for complete search history.

(56) References Cited

U.S. PATENT DOCUMENTS

| | | | | |
|---|---|---|---|---|
| 5,849,606 | A * | 12/1998 | Kikuchi et al. | 438/108 |
| 6,861,278 | B2 * | 3/2005 | Quinones et al. | 438/51 |
| 2005/0224939 | A1 * | 10/2005 | Seko | 257/678 |
| 2007/0007639 | A1 | 1/2007 | Fukazawa | |
| 2007/0045791 | A1 * | 3/2007 | Saeki | 257/668 |
| 2010/0258933 | A1 * | 10/2010 | Fujishima et al. | 257/686 |
| 2010/0261311 | A1 * | 10/2010 | Tsuji | 438/109 |

FOREIGN PATENT DOCUMENTS

JP 2007-36184 A 2/2007

* cited by examiner

*Primary Examiner* — Peniel M Gumedzoe

(74) *Attorney, Agent, or Firm* — Foley & Lardner LLP

(57) ABSTRACT

A method of manufacturing a semiconductor device in one exemplary embodiment includes preparing a first substrate and a second substrate, the first substrate including a bump electrode group formed of bump electrodes arrayed with a certain pitch, the number of bump electrodes along a first direction being larger than the number of bump electrodes along a second direction perpendicular to the first direction; joining the first substrate and the second substrate to each other through the bump electrodes so that a gap is formed between the first substrate and the second substrate; and filling the gap with a mold resin by causing the mold resin to flow in the gap from an edge of the first substrate along the second direction of the bump electrode group.

5 Claims, 13 Drawing Sheets

METHOD OF MANUFACTURING SEMICONDUCTOR DEVICE INCLUDING FILLING GAP BETWEEN SUBSTRATES WITH MOLD RESIN

This application is based upon and claims the benefit of priority from Japanese patent application No. 2010-265247, filed on Nov. 29, 2010, the disclosure of which is incorporated herein in its entirety by reference.

BACKGROUND OF THE INVENTION

1. Field of the Invention

The present invention relates to a method of manufacturing a semiconductor device in which a mold resin is formed in a gap between substrates.

2. Description of the Related Art

With the development of electronic devices reduced in size and improved in multifunctionality, semiconductor devices of a Chip on Chip (CoC) type in which a plurality of semiconductor chips having through electrodes are stacked have been proposed. In a CoC semiconductor device, a mold resin is ordinarily provided between semiconductor chips. JP2007-36184A discloses a CoC semiconductor device and a method of manufacturing the CoC semiconductor device.

JP2007-36184A also discloses joining a plurality of chips through bump electrodes and injecting a mold resin in liquid form into gaps between the chips. In ordinary cases, a mold resin is injected from a side of each of semiconductor chips into gaps between the semiconductor chips by a liquid discharge method.

For example, when a mold resin is injected into a gap between substrates such as those of semiconductor chips, there is a possibility of a region where a mold resin, e.g., an underfill material or the like is not formed, i.e., a void, being formed in the gap between the substrates. This is due to the occurrence of a difference in flow velocity of the mold resin between a region where bump electrodes exist and a region where no bump electrodes exist. The mold resin flows fast downstream in a region where no bump electrodes exist, and enters in a roundabout fashion a region downstream of the region where the bump electrodes exist. Due to such a flow of the mold resin in a roundabout fashion, a space surrounded by the mold resin, i.e., a void, occurs in the vicinity of the region where the bump electrodes exist.

In particular, if the pitch between the bump electrodes is reduced, variation in flow velocity of the mold resin is increased and the possibility of occurrence of a void is increased.

When treatment after filling the gaps between the substrates with the mold resin, e.g., a treatment for thermally setting the mold resin is performed, stress is caused in the substrates by thermal expansion and thermal contraction. The above-described void reduces the durability under thermal stress in the vicinity of joints of the bump electrodes. There is, therefore, a possibility of breakage of the bump electrodes and, hence, a reduction in reliability of the semiconductor device.

Therefore, there is a demand for providing a semiconductor device manufacturing method capable of reducing the occurrence of a void between substrates.

SUMMARY

A method of manufacturing a semiconductor device in one exemplary embodiment includes preparing a first substrate and a second substrate, the first substrate including a bump electrode group formed of bump electrodes arrayed with a certain pitch, the number of bump electrodes along a first direction being larger than the number of bump electrodes along a second direction perpendicular to the first direction; joining the first substrate and the second substrate to each other through the bump electrodes so that a gap is formed between the first substrate and the second substrate; and filling the gap with a mold resin by causing the mold resin to flow in the gap from an edge of the first substrate along the second direction of the bump electrode group.

According to this method, the mold resin is caused to flow along the direction (second direction) in which the smaller number of bump electrodes are arranged and, therefore, the difference in the moving speed of the mold resin between a region in which the mold resin collides against the bump electrode group and the other regions can be reduced. In this way, prevention of flowing of the mold resin in a roundabout fashion during movement of the mold resin is enabled and the occurrence of voids between the first substrate and the second substrate is reduced. Thus, the reliability of the semiconductor device can be improved.

The above and other objects, features and advantages of the present invention will become apparent from the following description with reference to the accompanying drawings which illustrate examples of the present invention.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The present invention relates to a method of manufacturing a semiconductor device in which a mold resin is formed in a gap between substrates. The substrates may be a semiconductor chip or a wiring substrate.

Figure 1A:
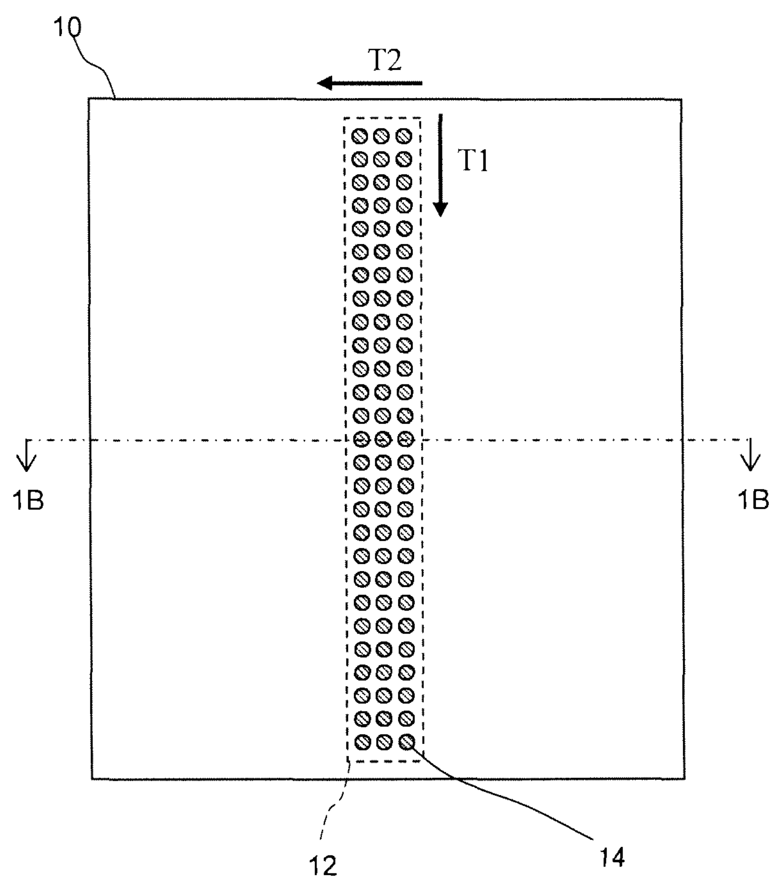
FIG. 1A is a schematic plan view of a semiconductor chip.
Figure 1B:
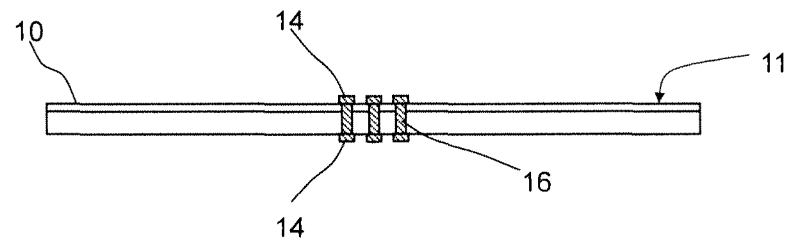
FIG. 1B is a schematic sectional view of the semiconductor chip taken along line 1B-1B in FIG. 1A.

In a manufacturing method in a first exemplary embodiment, a semiconductor chip forming a semiconductor device is prepared. FIG. 1A is a schematic plan view of a semiconductor chip 10 forming a semiconductor device. FIG. 1B is a schematic sectional view of the semiconductor chip 10 taken along line 1B-1B in FIG. 1A.

Semiconductor chip 10 may be of any type. In the present exemplary embodiment, semiconductor chip 10 is in the form of a generally rectangular plate and has a predetermined circuit formed on one surface 11. Semiconductor chip 10 may be, for example, a memory chip on which a memory circuit is formed.

The semiconductor chip 10 includes bump electrode group 12 for external electrical connection. In this specification, "bump electrode group 12" refers to a group of electrodes formed of bump electrodes 14 arrayed with a certain pitch. In bump electrode group 12, the number of bump electrodes 14 arranged in longitudinal direction (also referred to as "first direction" or "row direction") T1 is larger than the number of bump electrodes 14 arranged in lateral direction (also referred to as "second direction" or "column direction") T2. Bump electrode group 12 is formed of bump electrodes 14 arrayed, for example, in 27 rows and 3 columns in a lattice pattern with a 50 μm pitch.

Bump electrodes 14 are disposed on both surfaces of semiconductor chip 10. Bump electrodes 14 on the front surface and bump electrodes 14 on the back surface corresponding to those on the front surface are electrically connected to each other by through electrodes 16. In the present exemplary embodiment, a plurality of semiconductor chips 10 constructed as described above are prepared.

Figure 2A:
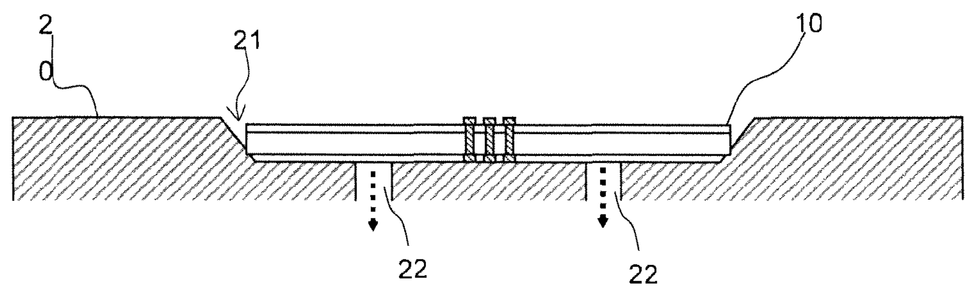
FIGS. 2A to 2C are diagrams showing a process of stacking a plurality of semiconductor chips.
Figure 2B:
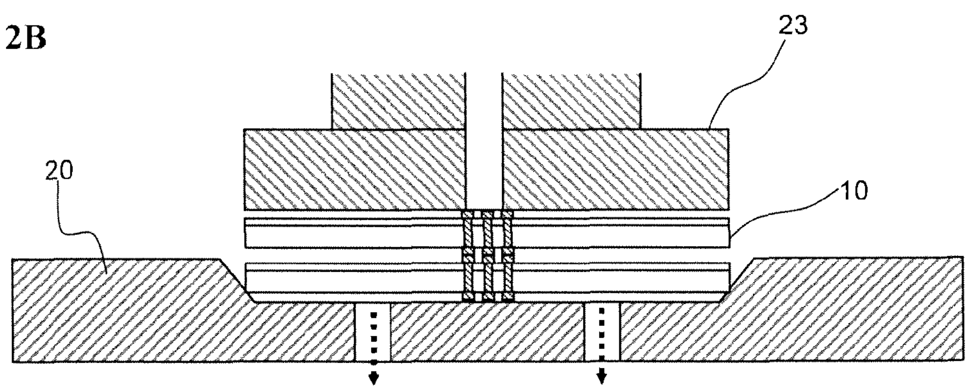
Figure 2C:
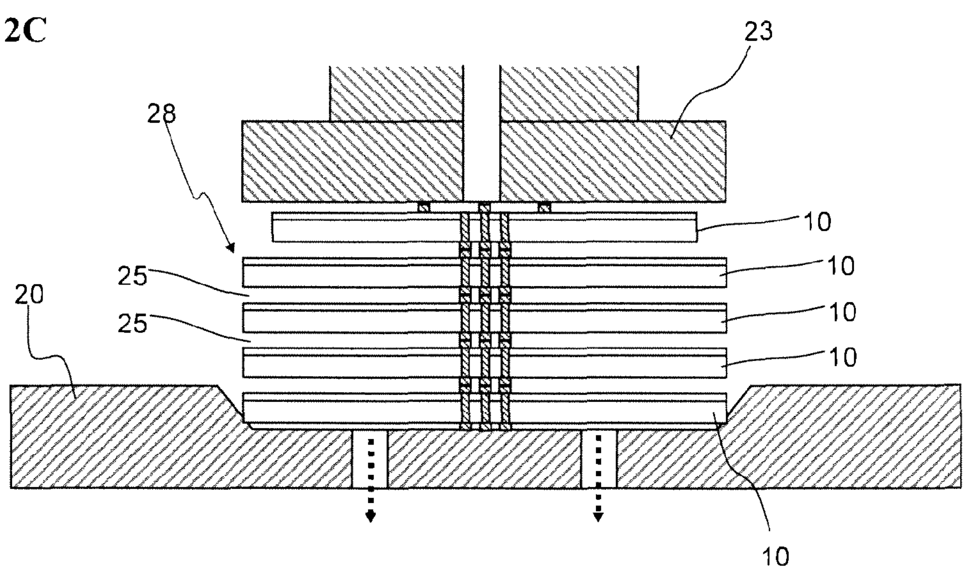

FIGS. 2A, 2B, and 2C are schematic sectional views showing a process of stacking the plurality of semiconductor chips. First, as shown in FIG. 2A, semiconductor chip 10 is placed on attraction stage 20 with its front surface 11, more specifically the circuit formation surface facing upward. Recess 21 is formed in attraction stage 20. Semiconductor chip 10 is placed in recess 21. The semiconductor chip 10 is held and fixed by being vacuum-attracted through attraction holes 22 by a vacuum device (not shown).

Next, second-stage semiconductor chip 10 is mounted on first-stage semiconductor chip 10 held on attraction stage 20, as shown in FIG. 2B. Second-stage semiconductor chip 10 receives a load applied from bonding tool 23 while being heated and maintained at, for example, about 300° C. by bonding tool 23. Second-stage semiconductor chip 10 is thereby joined to first-stage semiconductor chip 10 through bump electrodes 14.

Second-stage semiconductor chip 10 may be a chip of a function different from or the same as that of first-stage semiconductor chip 10. Bump electrodes 14 on the front surface of the first-stage semiconductor chip 10 and bump electrodes 14 on the back surface of second-stage semiconductor chip 10 are connected to each other by thermocompression bonding. Second-stage semiconductor chip 10 is thus mounted on the front surface of first-stage semiconductor chip 10. By joining semiconductor chips 10 to each other through bump electrodes 14 in this way, gap 25 is formed between semiconductor chips 10.

As shown in FIG. 2C, third-stage semiconductor chip 10 is mounted on second-stage semiconductor chip 10; fourth-stage semiconductor chip 10, on third-stage semiconductor chip 10; and fifth-stage semiconductor chip 10, on fourth-stage semiconductor chip 10. In the example shown in FIG. 2C, first-stage to fourth-stage semiconductor chips 10 are memory chips, while fifth-stage semiconductor chip 10 is an interface (IF) chip. Thus, chip stack 28 in which the four memory chips and one IF chip are stacked one on another is formed.

Bump electrodes 14 on the front surface of the IF chip are connected to connection pads on a wiring substrate described below. Therefore, bump electrodes 14 on the front surface of the IF chip are arrayed with a large pitch not smaller than 200 μm. Bump electrodes 14 on the back surface of the IF chip are disposed in correspondence with bump electrodes 14 on the front surface of fourth-stage semiconductor chip 10.

Chip stack 28 may not include any IF chip in a construction alternative to the above-described example. For example, if a circuit that controls the semiconductor chips is provided in an apparatus incorporating the semiconductor device, the IF chip is unnecessary because of duplication of the function of controlling the semiconductor chips.

In the above-described example of the chip stack, a plurality of memory chips are stacked one on another with through electrodes interposed therebetween. The chip stack may alternatively be formed of a combination of a memory chip and a logic chip, for example. The chip stack may be formed of a combination of chips that have other functions.

Figure 3A:
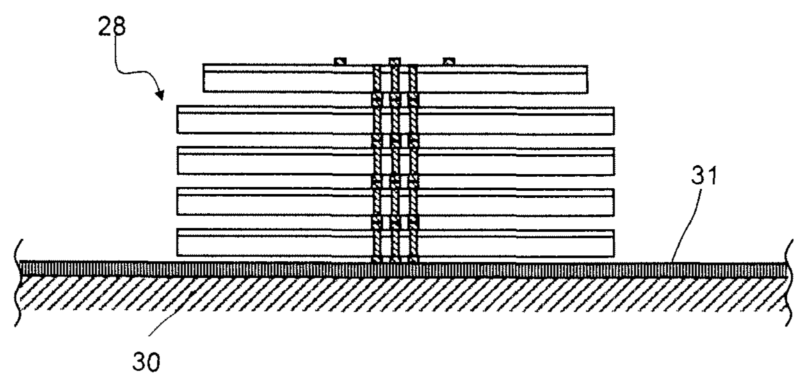
FIGS. 3A to 3D are diagrams showing a process of forming a mold resin on a chip stack.

FIGS. 3A to 3D are sectional views showing a process of forming a mold resin on the chip stack. Preferably, in this process, as shown in FIG. 3A, chip stack 28 is mounted on application sheet 31 attached to the surface of stage 30. Application sheet 31 is preferably a member that has low wettability to an underfill material provided as the mold resin, e.g., a fluorine-based sheet or a sheet on which a silicone-based adhesive is attached.

Figure 3B:
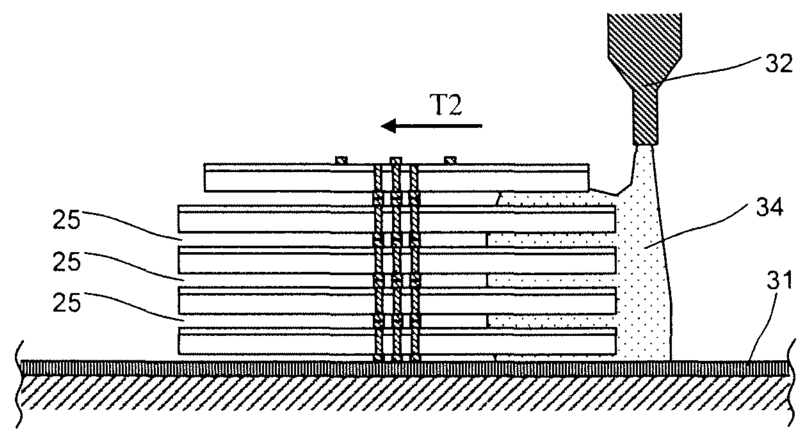

Next, as shown in FIG. 3B, underfill material 34 is supplied to the vicinity of an end portion of chip stack 28 by dispenser 32. Underfill material 34 flows in gaps 25 between the semiconductor chips due to a capillary phenomenon to fill gaps 25 between the semiconductor chips.

Figure 4A:
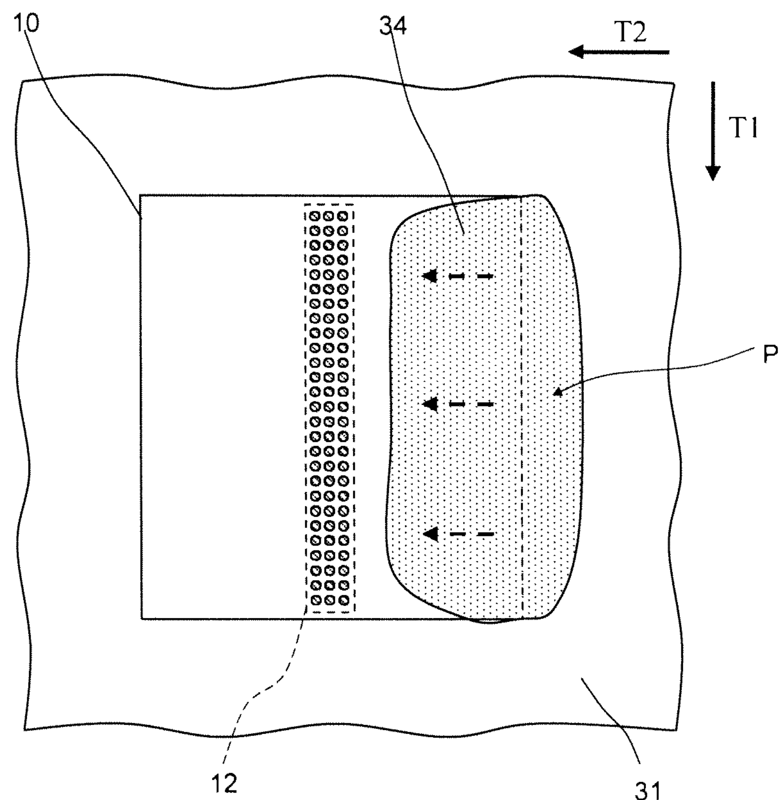
FIGS. 4A and 4B are diagrams showing a state in which an underfill material moves in a gap between semiconductor chips.
Figure 4B:
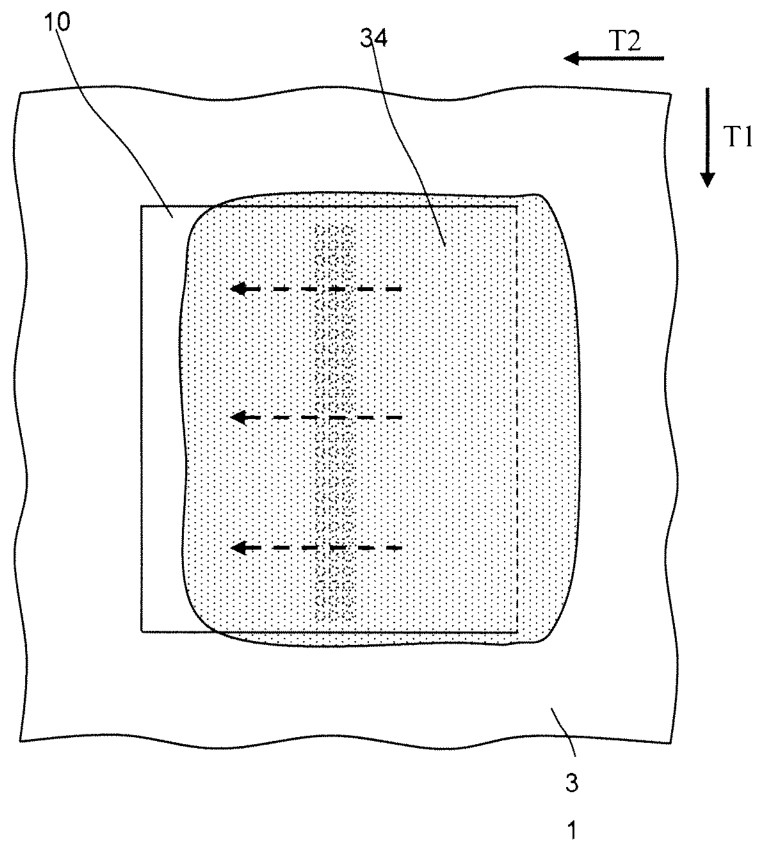

FIGS. 4A and 4B show a state in which underfill material 34 moves in gap 25 between semiconductor chips 10 in chip stack 28. Underfill material 34 is supplied to a supply position P (see FIG. 4A) in the vicinity of a shorter side of semiconductor chip 10 in lateral direction T2 of bump electrode group 12. Underfill material 34 flows along lateral direction T2 of bump electrode group 12 in gaps 25 between the semiconductor chips due to the capillary phenomenon, (see FIG. 4B). Gaps 25 between the semiconductor chips are thus filled with underfill material 34.

Underfill material 34 is caused to flow along second direction T2 in which the smaller number of bump electrodes 14 are arranged. Therefore, the difference in moving speed of underfill material 34 between a region where underfill material 34 collides against bump electrode group 12 and other regions is reduced. Thus, flowing of underfill material 34 in a roundabout fashion is prevented to reduce the occurrence of voids in gaps 25 between the semiconductor chips. As a result, the reliability of the semiconductor device is improved.

In a case where application sheet 31 is formed of a material that has low wettability to underfill material 34, spreading of underfill material 34 on application sheet 31 can be limited, thereby reducing the fillet width.

It is preferable that semiconductor chip 10 be rectangular and the longer sides of semiconductor chip 10 be set parallel to longitudinal direction T1 of bump electrode group 12. In such a case, underfill material 34 flows along lateral direction T2 of bump electrode group 12 from one of the longer sides of semiconductor chip 10. The distance through which underfill material 34 flows can be reduced in this way to increase the speed of filling with the underfill material.

Figure 3C:
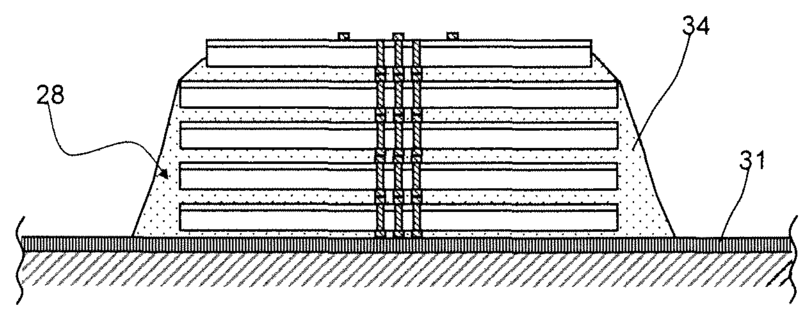

As shown in FIG. 3C, after the completion of filling of underfill material 34 in chip stack 28, chip stack 28 is cured together with application sheet 31 at a predetermined temperature of, for example, about 150° C. Underfill material 34 is thereby set and formed as a mold resin around chip stack 28 and in the gaps between the semiconductor chips. Application sheet 31 is capable of preventing attachment of underfill material 34 to stage 30.

Figure 3D:
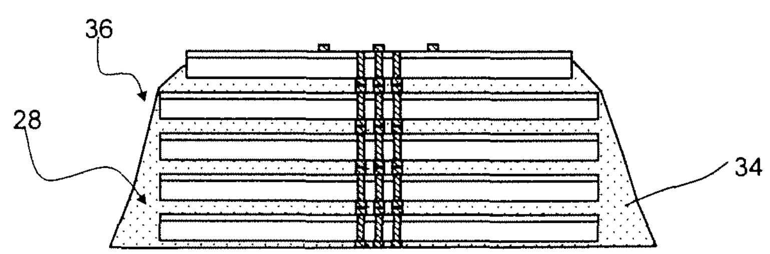

After thermosetting of underfill material 34, chip stack 28 is picked up from application sheet 31. Chip stack 28 with mold resin 34 formed thereon is thereby obtained, as shown in FIG. 3D. Advantageously, use of application sheet 31 formed of a material that has low wettability to underfill material 34 facilitates picking-up of chip stack 28.

The structure in which the mold resin is formed in the gaps between the semiconductor chips will be referred to as combination chip stack 36 below.

An example of a procedure of assembling the semiconductor device after making combination chip stack 36 in the above-described way will be described with reference to FIGS. 5A to 5C, and 6A to 6C. FIGS. 5A to 5C, and 6A to 6C show an assembly procedure for collectively forming a plurality of semiconductor devices.

Figure 5A:
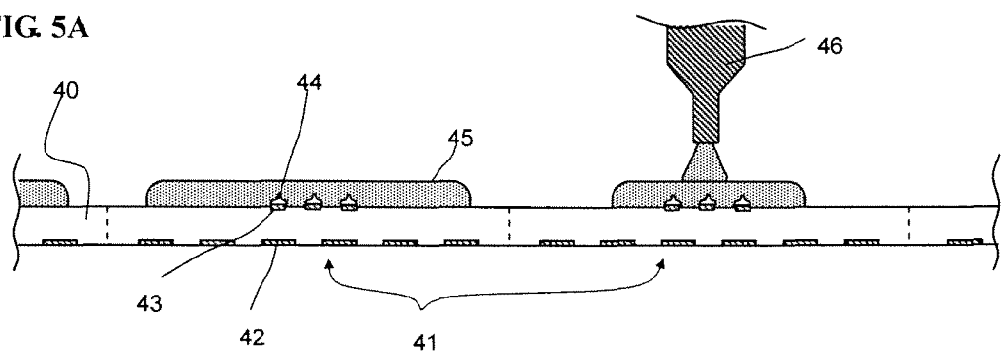
FIGS. 5A to 5C are diagrams showing a process of mounting combination chip stacks with the mold resin formed on a wiring substrate.
Figure 5B:
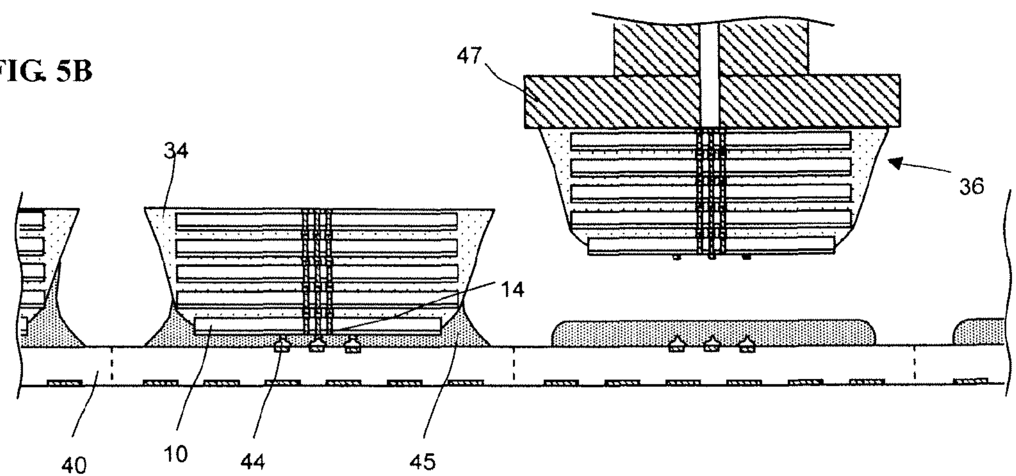
Figure 5C:
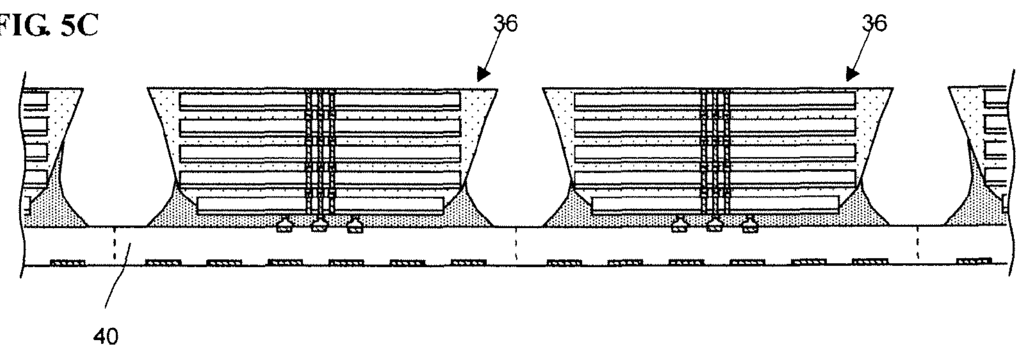

As shown in FIGS. 5A to 5C, wiring substrate 40 with a plurality of product forming portions 41 disposed in matrix form is first prepared. Each of product forming portions 41 is a portion that forms wiring substrate 40 for the semiconductor device. A predetermined pattern of wiring is formed in each product forming portion 41. Each wiring is covered with an insulating film such as a solder resist film except at wire bumps 44 and lands 42. Dicing lines along which each semiconductor device is cut away are defined between product forming portions 41 on wiring substrate 40.

A plurality of connection pads 43 for connection to combination chip stacks 36 are formed on one surface of wiring substrate 40. A plurality of lands 42 for connection to metal balls (see reference sign 51 in FIGS. 6A to 6C as well) that serve as external terminals are formed on the other surface of wiring substrate 40. Connection pads 43 are connected to predetermined lands 42 by wiring.

Wire bumps 44 are provided on connection pads 43. Each wire bump 44 can be formed by preparing Au wire, Cu wire or the like with its tip molten into a ball-like shape, joining the wire on the connection pad 43 on wiring substrate 40, for example, by ultrasound thermocompression bonding, and thereafter drawing and breaking the wire. A reduction in size of through electrodes 16 of semiconductor chip 10 and/or a reduction in the pitch between through electrodes 16 can be achieved by forming wire bumps 44 on the wiring substrate 40 side. Wire bumps 44 may alternatively be formed on the combination chip stack 36 side.

In the present exemplary embodiment, an example of forming wire bumps 44 on connection pads 43 for the purpose of facilitating connection between combination chip stack 36 and wiring substrate 40 has been shown. However, connection pads on wiring substrate 40 may alternatively be connected directly to bump electrodes 14 on the front surface in combination chip stack 36.

After the completion of preparation of wiring substrate 40, insulating bonding material 45 is applied on each product forming portions 41 of wiring substrate 40 by dispenser 46, as shown in FIG. 5A. As bonding material 45, a non-conductive paste (NCP), for example, may be used.

Next, combination chip stacks 36 are mounted on product forming portions 41 of wiring substrate 40 by being attracted and held by bonding tool 47 or the like (see FIG. 5B). Bump electrodes 14 of semiconductor chip (IF chip) 10 in the uppermost layer of each combination chip stack 36 and wire bumps 44 on wiring substrate 40 are joined to each other, for example, by using thermocompression bonding. At this time, bonding material 45 on wiring substrate 40 is filled between combination chip stack 36 and wiring substrate 40 to bond and fix wiring substrate 40 and combination chip stack 36 on each other. Since mold resin 34 is formed in tapered form around combination chip stack 36, climbing-up of bonding material 45 can be prevented. Thus, the occurrence of breakage, connection failure or the like in combination chip stack 36 due to attachment of bonding material 45 to bonding tool 47 can be reduced.

In the above-described way, wiring substrate 40 on which combination chip stacks 36 are mounted is completed, as shown in FIG. 5C. Wiring substrate 40 on which combination chip stacks 36 are mounted is set in a forming mold formed of an upper mold and a lower mold in a transfer molding apparatus (not shown) for transition to a molding process.

In the upper mold of the forming mold, a cavity (not shown) that covers all the plurality of combination chip stacks 36 is formed, and combination chip stacks 36 are accommodated in the cavity.

Next, mold resin heated and molten is injected into the cavity provided in the upper mold of the forming mold, and the cavity is thereby filled with the mold resin so that the mold resin covers the entire combination chip stacks 36. A thermosetting resin such as epoxy resin is used as the mold resin.

Figure 6A:
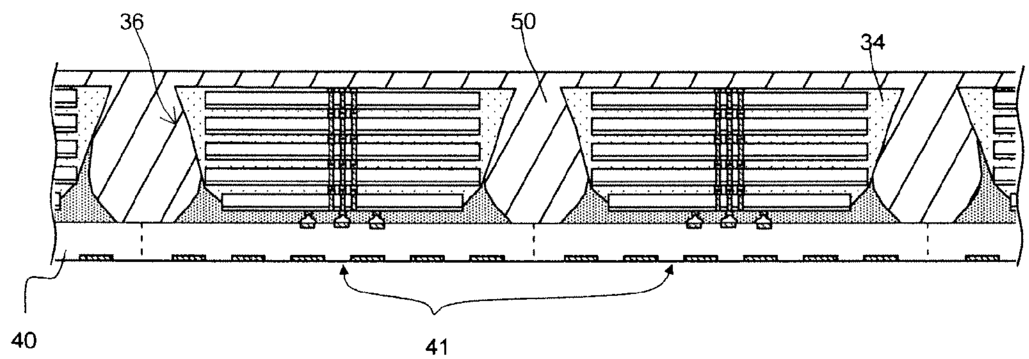
FIGS. 6A to 6C are diagrams showing a process of connecting external terminals to the wiring substrate.

In a state where the cavity is filled with the mold resin, the mold resin is thermally set by being cured at a predetermined temperature of, for example, about 180° C. Mold resin layer 50 that covers all combination chip stacks 36 mounted on the plurality of product forming portions 41 is thereby formed, as shown in FIG. 6A. Further, by baking at a predetermined temperature, mold resin layer 50 is completely set.

In the present exemplary embodiment, second mold resin layer 50 that covers all combination chip stacks 36 is formed after filling the gaps between semiconductor chips 10 with mold resin (underfill material) 34, thereby improving the effect of reducing the occurrence of voids in the gaps between semiconductor chips 10.

Figure 6B:
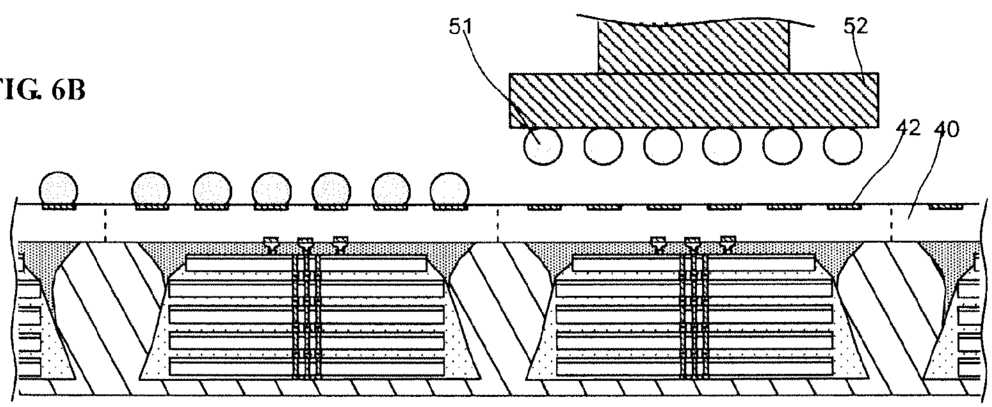

After forming second mold resin layer 50, transition to a ball mount process is made, as shown in FIG. 6B. In the ball mount process, electroconductive metal balls 51, e.g., solder balls that serve as external terminals for semiconductor devices are connected to lands 42 formed on wiring substrate 40.

In the ball mount process, a plurality of metal balls 51 are attracted to and held by mount tool 52 having a plurality of attraction holes at positions coinciding with the positions of lands 42. After transfer of flux onto metal balls 51, metal balls 51 are collectively mounted on lands 42.

After mounting metal balls 51 on all product forming portions 41, wiring substrate 40 is subjected to reflowing to connect metal balls 41 to lands 42.

After the completion of connection of metal balls 41, transition to a substrate dicing process is made. In the substrate dicing process, individual product forming portions 41 are cut along the predetermined dicing lines to be separated from each other, thereby forming semiconductor devices.

Figure 6C:
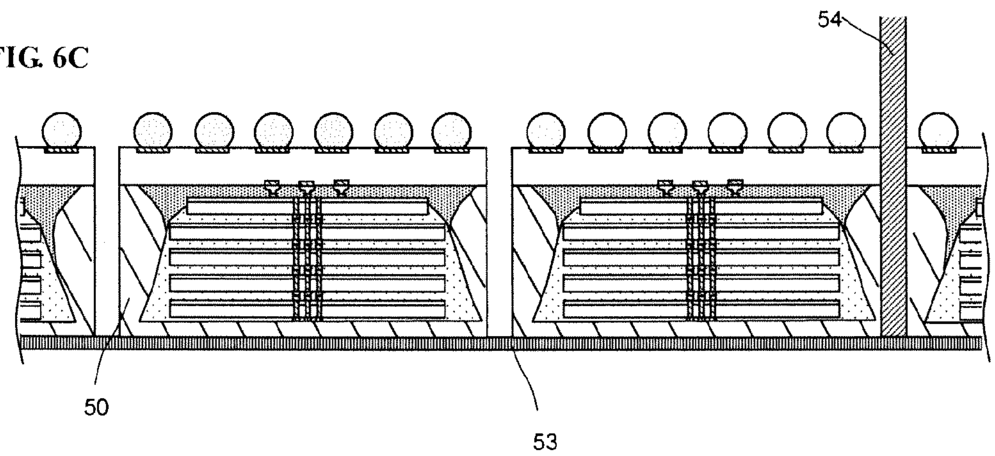
Figure 7:
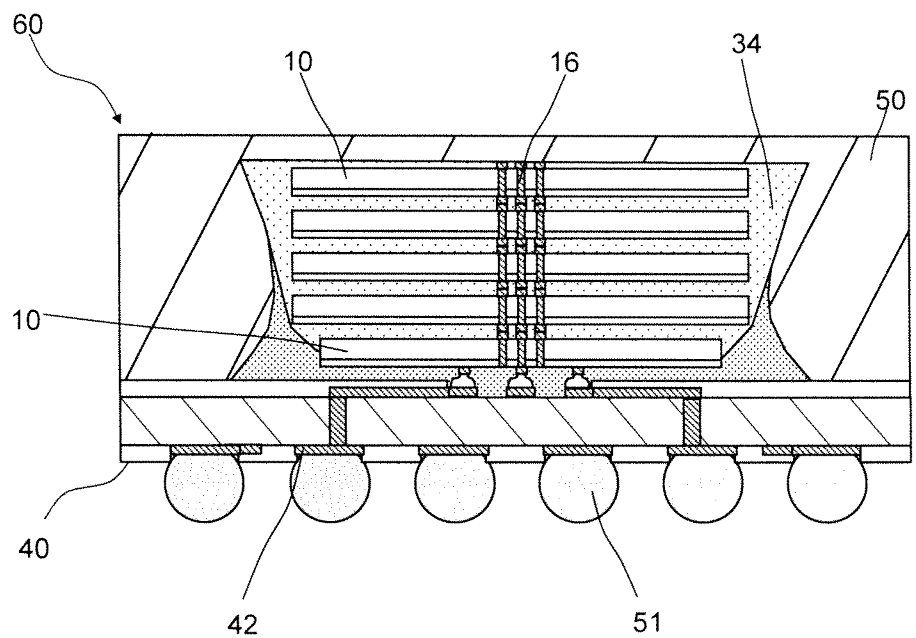
FIG. 7 is a schematic sectional view of a semiconductor device manufactured by a semiconductor device manufacturing method in a first exemplary embodiment.

In the substrate dicing process, dicing tape 53 is adhered to second mold resin layer 50 to support product forming portions 41. Then, as shown in FIG. 6C, cutting along the predetermined dicing lines with dicing blade 54 provided in a dicing apparatus (not shown) is performed to separate each product forming portion 41. After cutting and separating, the product forming portions are picked up from dicing tape 53 to obtain semiconductor devices 60 shown in FIG. 7. In FIG. 7, members identical or corresponding to those shown in the other figures are indicated by the same reference numerals.

Figure 8A:
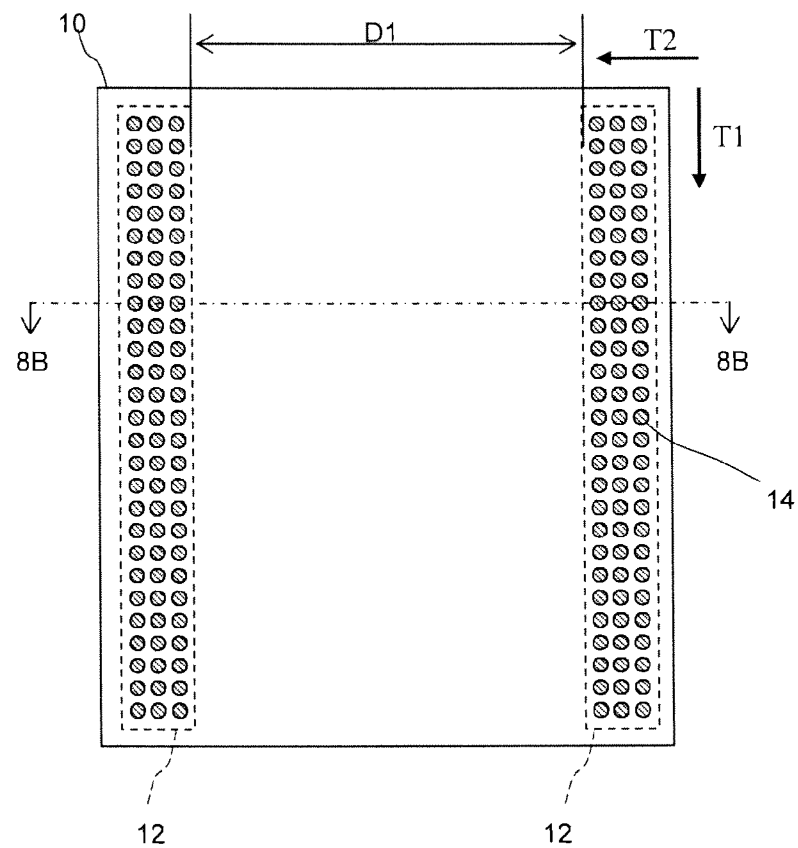
FIG. 8A is a schematic plan view of a semiconductor chip in a second exemplary embodiment.
Figure 8B:
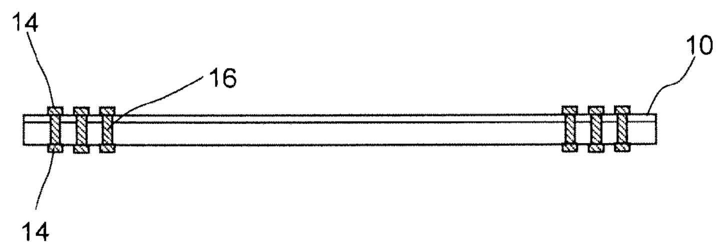
FIG. 8B is a schematic sectional view of the semiconductor chip taken along line 8B-8B in FIG. 8A.

A method of manufacturing a semiconductor device in a second exemplary embodiment will be described. The disposition of bump electrodes provided on a semiconductor chip in the second exemplary embodiment differs from that on the semiconductor chip shown in FIGS. 1A and 1B. FIG. 8A is a schematic plan view of the semiconductor chip used in the second exemplary embodiment. FIG. 8B is a schematic sectional view of the semiconductor chip taken along line 8B-8B in FIG. 8A.

Two bump electrode groups 12 formed of bump electrodes 14 arrayed with a substantially constant pitch are provided on semiconductor chip 10. In each bump electrode group 12, the number of bump electrodes 14 arranged in longitudinal direction (first direction) T1 is larger than the number of bump electrodes 14 arranged in lateral direction (second direction) T2. Each bump electrode group 12 is formed of bump electrodes 14 arrayed, for example, in 27 rows and 3 columns in a lattice pattern with a 50 μm pitch.

Bump electrodes 14 are disposed on the front and back surfaces of semiconductor chip 10. Bump electrodes 14 on the front surface and bump electrodes 14 on the back surface corresponding to those on the front surface are connected to each other by through electrodes 16.

Two bump electrode groups 12 are placed side by side along lateral direction T2. It is preferable that distance D1 between bump electrode groups 12 be larger than the pitch between bump electrodes 14 forming bump electrode groups 12 and not smaller than 200 μm. Each bump electrode group 12 is positioned in the vicinity of an end side, e.g., one of the longer sides of semiconductor chip 10.

A chip stack is formed by using semiconductor chip 10 thus formed, as is that in the first exemplary embodiment. An underfill material is caused to flow in gaps between semiconductor chips forming the chip stack along lateral direction T2 of bump electrode groups 12. In this case, as in the case of the first exemplary embodiment, the occurrence of voids between the semiconductor chips is reduced.

Even if a difference in flow velocity of the underfill material occurs between the region where bump electrode groups 12 exist and a region where no bump electrode groups 12 exist while the underfill material is flowing in lateral direction T2, the difference in flow velocity of the underfill material can be limited in region D1 between the bump electrode groups. Therefore, the influence of a difference in flow velocity at each bump electrode group 12 is not accumulated, and the occurrence of a void in the vicinity of each bump electrode group 12 can be reduced. In particular, the inventor confirmed that no void occurred between semiconductor chips 10 when distance D1 between bump electrode groups 12 in lateral direction T2 was not smaller than 200 μm.

In the second exemplary embodiment, bump electrode groups 12 are disposed at two opposite sides of each semiconductor chip 10 and therefore, the semiconductor chips 10 can be securely joined to each other. Also, the chip stack can be securely mounted on a wiring substrate.

While two bump electrode groups 12 are placed side by side in lateral direction T2 in the arrangement shown in FIGS. 8A and 8B, two or more bump electrode groups 12 may be placed side by side in lateral direction T2. In such a case, it is also preferable that the distance between bump electrode groups 12 be no smaller than 200 μm.

Figure 9A:
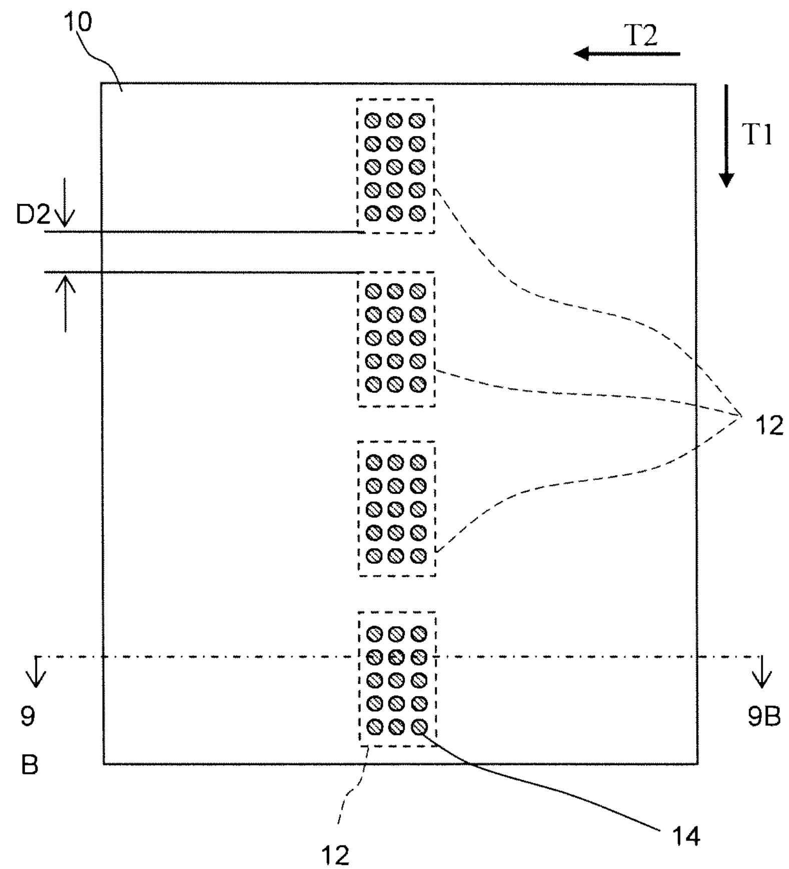
FIG. 9A is a schematic plan view of a semiconductor chip in a third exemplary embodiment.
Figure 9B:
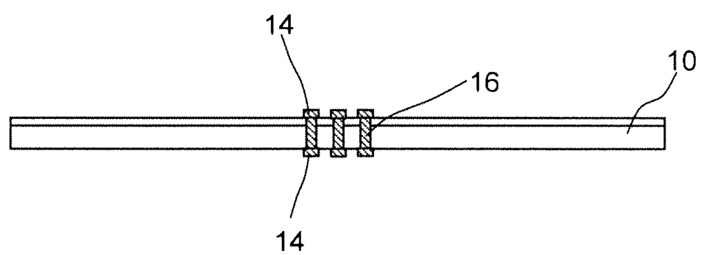
FIG. 9B is a schematic sectional view of the semiconductor chip taken along line 9B-9B in FIG. 9A.

A method of manufacturing a semiconductor device in a third exemplary embodiment will be described. The disposition of bump electrodes provided on a semiconductor chip (substrate) in the third exemplary embodiment differs from that on the semiconductor chip shown in FIGS. 1A and 1B. FIG. 9A is a schematic plan view of the semiconductor chip used in the third exemplary embodiment. FIG. 9B is a schematic sectional view of the semiconductor chip taken along line 9B-9B in FIG. 9A.

Bump electrodes 14 are disposed on the front and back surfaces of semiconductor chip 10. Bump electrodes 14 on the front surface and bump electrodes 14 on the back surface corresponding to those on the front surface are connected to each other by through electrodes 16.

In each of bump electrode groups 12, the number of bump electrodes 14 arranged in longitudinal direction (first direction) T1 is larger than the number of bump electrodes 14 arranged in lateral direction (second direction) T2. In the example shown in FIGS. 9A and 9B, each bump electrode group 12 is formed of bump electrodes 14 arrayed, for example, in 5 rows and 3 columns in a lattice pattern with a 50 μm pitch. In the present exemplary embodiment, a plurality of bump electrode groups 12 are disposed by being spaced apart from each other by a distance of 700 μm or less in longitudinal direction T1. In the example shown in FIGS. 9A and 9B, four bump electrode groups 12 are disposed by being spaced apart from each other along the longitudinal direction T1. Distance D2 between each adjacent pair of bump electrode groups 12 is larger than the pitch between bump electrodes 14 forming the bump electrode groups and not larger than 700 μm.

A chip stack is formed by using semiconductor chip 10 thus formed, as is the case in the first exemplary embodiment. An underfill material is caused to flow in gaps between semiconductor chips forming the chip stack along lateral direction T2 of bump electrode groups 12.

In the case where a plurality of bump electrode groups are disposed in a row in the longitudinal direction, it is preferable that the distance between bump electrode groups 12 be not larger than 700 μm. When the distance between bump electrode groups 12 is not larger than 700 μm, the difference between the flow velocity of the mold resin in the regions where bump electrode groups 12 are disposed and the flow velocity of the mold resin in the region where no bump electrode groups 12 are disposed can be limited to a sufficiently small value. Thus, flowing of the mold resin in a roundabout fashion due to a difference in flow velocity can be prevented to reduce the occurrence of voids in the gaps between the semiconductor chips.

It was actually confirmed that when distance D2 between bump electrode groups 12 was 700 μm, no voids occurred in the gaps between the semiconductor chips. The temperature of the underfill material as the mold resin at the time of application was about 80° C., and the viscosity of the mold resin at this temperature was about 0.1 Pa·s. The viscosity of the mold resin at ordinary temperature was about 10 Pa·s. As a result, it was understood that when the mold resin, whose viscosity was within such a range, was used, and when distance D2 between bump electrode groups 12 in the longitudinal direction was no larger than 700 μm, the difference in flow velocity of the mold resin was limited and the effect of reducing the occurrence of voids was improved. Similarly, it is preferable that the distance between the end sides of semiconductor chips 10 and bump electrode groups 12 in longitudinal direction T1 be not larger than 700 μm.

Further, because of nonexistence of through holes 16 formed through semiconductor chips 10 in the region where no bump electrode groups 12 are provided, the strength of semiconductor chips 10 can be improved. Thus, the occurrence of chip cracks which may be formed from through holes 16 acting as starting points can be reduced.

Figure 10A:
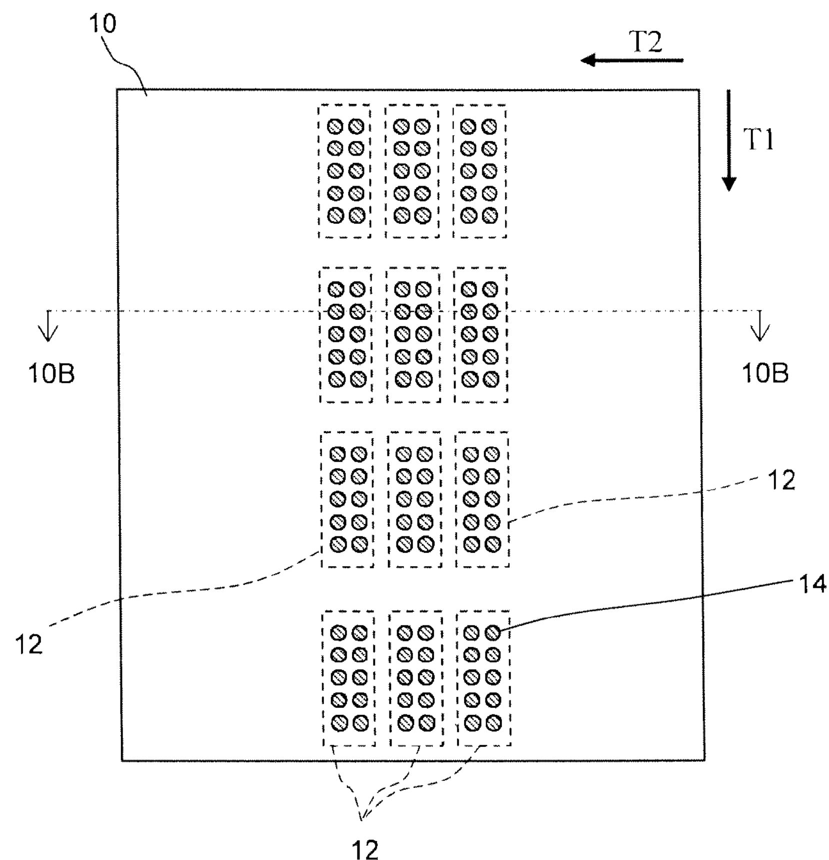
FIG. 10A is a schematic plan view of a semiconductor chip in a fourth exemplary embodiment.
Figure 10B:
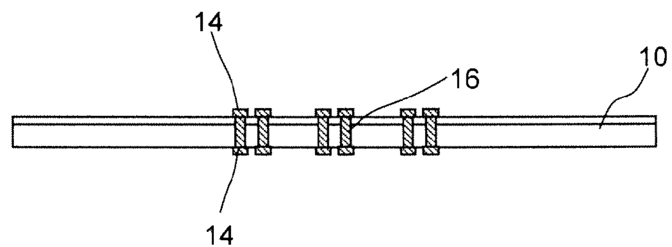
FIG. 10B is a schematic sectional view of the semiconductor chip taken along line 10B-10B in FIG. 10A.

A method of manufacturing a semiconductor device in a fourth exemplary embodiment will be described. The disposition of bump electrodes provided on a semiconductor chip in the fourth exemplary embodiment differs from that on the semiconductor chip shown in FIGS. 1A and 1B. FIG. 10A is a schematic plan view of the semiconductor chip used in the fourth exemplary embodiment. FIG. 10B is a schematic sectional view of the semiconductor chip taken along line 10B-10B in FIG. 10A.

Bump electrodes 14 are disposed on the front and back surfaces of semiconductor chip 10. Bump electrodes 14 on the front surface and bump electrodes 14 on the back surface corresponding to those on the front surface are connected to each other by through electrodes 16.

In each of bump electrode groups 12, the number of bump electrodes 14 arranged in longitudinal direction T1 is larger than the number of bump electrodes 14 arranged in lateral direction T2. In the example shown in FIGS. 10A and 10B, each bump electrode group 12 is formed of bump electrodes 14 arrayed, for example, in 5 rows and 2 columns in a lattice pattern with a 50 μm pitch. Bump electrode groups 12 are disposed, for example, by being spaced apart from each other by a distance of about 700 μm in the lateral direction and by being spaced apart from each other by a distance of about 700 μm or less in the longitudinal direction. Referring to FIGS. 10A and 10B, at about a center of the semiconductor chip, four bump electrode groups 12 are disposed along longitudinal direction T1, and three bump electrode groups along lateral direction T2.

Also in the present exemplary embodiment, an underfill material is caused to flow along lateral direction T2 of bump electrode groups 12. Also in this case, as in the case of the first exemplary embodiment, the effect of reducing the occurrence of voids between semiconductor chips can be obtained. Also, in the present exemplary embodiment, each of the numbers of bump electrodes 14 respectively forming bump electrode groups 12 is reduced to improve the effect of reducing the occurrence of voids at or in the vicinity of bump electrode group 12.

Figure 11A:
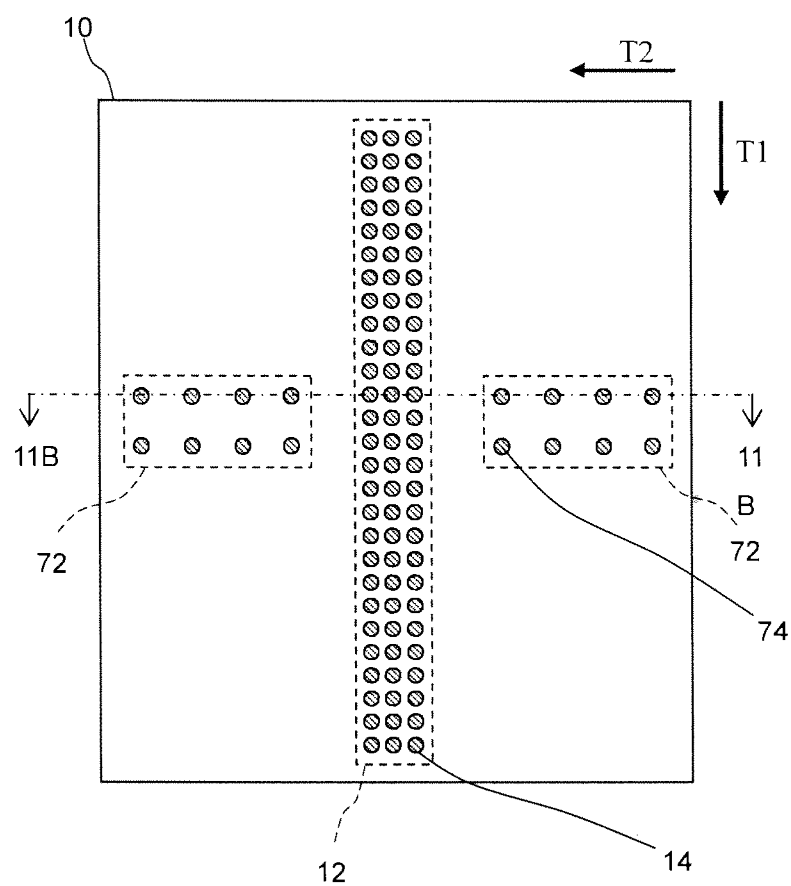
FIG. 11A is a schematic plan view of a semiconductor chip in a fifth exemplary embodiment.
Figure 11B:
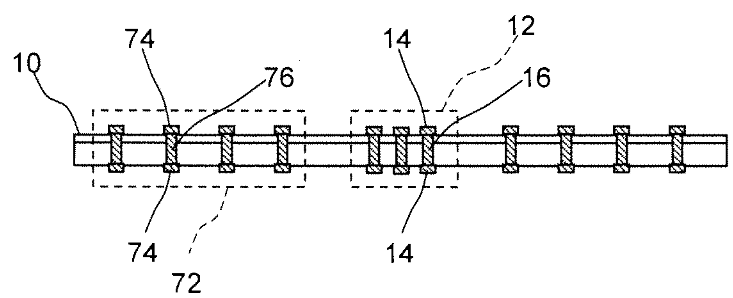
FIG. 11B is a schematic sectional view of the semiconductor chip taken along line 11B-11B in FIG. 11A.

A method of manufacturing a semiconductor device in a fifth exemplary embodiment will be described. The disposition of bump electrodes provided on a semiconductor chip (substrate) in the fifth exemplary embodiment differs from that on the semiconductor chip shown in FIGS. 1A and 1B. FIG. 11A is a schematic plan view of the semiconductor chip used in the fifth exemplary embodiment. FIG. 11B is a schematic sectional view of the semiconductor chip taken along line 11B-11B in FIG. 11A.

Bump electrodes 14 and 74 are disposed on the front and back surfaces of semiconductor chip 10. Bump electrodes on the front surface and bump electrodes on the back surface corresponding to those on the front surface are connected to each other by through electrodes 16 and 76.

In the present exemplary embodiment, first bump electrode group 12 and second bump electrode groups 72 exist. Each second bump electrode group is formed of bump electrodes 74 disposed with a pitch larger than the pitch between bump electrodes 14 forming first bump electrode group 12.

In first bump electrode group 12, the number of bump electrodes 14 arranged in longitudinal direction T1 is larger than the number of bump electrodes 14 arranged in lateral direction T2. In the example shown in FIGS. 11A and 11B, each bump electrode group 12 is formed of bump electrodes 14 arrayed, for example, in 27 rows and 3 columns in a lattice pattern with a 50 μm pitch.

The pitch between bump electrodes 74 forming second bump electrode group 72 is not smaller than 200 μm. In second bump electrode group 72, the number of bump electrodes 74 arranged in longitudinal direction T2 is larger than the number of bump electrodes 14 arranged in lateral direction T1. In the present exemplary embodiment, an underfill material is caused to flow along lateral direction T2 of first bump electrode group 12. Also in this case, the same effect as that in the first exemplary embodiment can be obtained.

Under the presence of bump electrode groups 72 having bump electrodes 74 arrayed with a sufficiently large pitch as shown in FIGS. 11A and 11B, no voids occur irrespective of the direction of flow of the mold resin. It was actually confirmed that in the presence of bump electrode groups 72 having bump electrodes 74 disposed with a pitch of 200 μm or more, no voids occurred irrespective of the direction of flow of the mold resin. Therefore, with respect to first bump electrode group 12 in which bump electrodes 14 are disposed with a small pitch, a 50 μm pitch in this example, the mold resin may be caused to flow in direction (second direction) T2 in which the smaller number of bumps are arranged.

Figure 12:
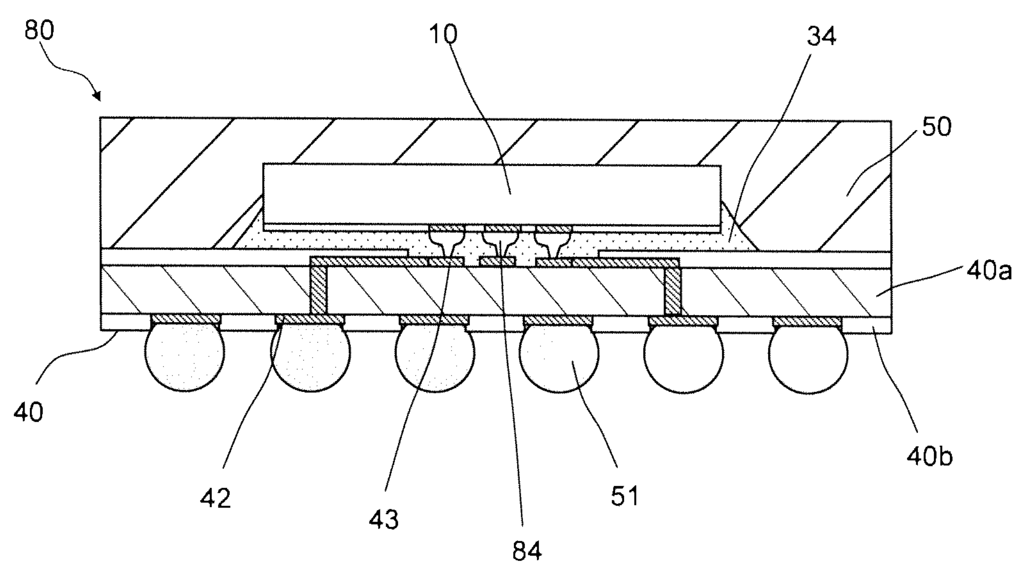
FIG. 12 is a schematic sectional view of a semiconductor device manufactured according to a semiconductor device manufacturing method in a sixth exemplary embodiment.

A method of manufacturing a semiconductor device in a sixth exemplary embodiment will be described. FIG. 12 is a schematic sectional view of a semiconductor device manufactured by the semiconductor manufacturing method in the sixth embodiment.

This semiconductor device 80 includes wiring substrate 40 and semiconductor chip 10 mounted on wiring substrate 40. Wiring substrate 40 includes insulating base member 40*a* and insulating film 40*b*, e.g., a solder resist on a front surface of the insulating base member 40*a*.

Connection pads 43 exposed out of insulating film 40*b* are provided on one surface of the wiring substrate. Lands 42 are provided on the other surface of the wiring substrate. Metal balls 51 that serve as external terminals are provided on lands 42.

Semiconductor chip 10 and wiring substrate 40 are joined to each other through bump electrodes 84. Gaps between semiconductor chip 10 and wiring substrate 40 are filled with mold resin 34. Second mold resin 50 that covers semiconductor chip 10 and mold resin 34 is provided on wiring substrate 40.

A plurality of bump electrodes 84 are arrayed with a substantially constant pitch to form a bump electrode group. The number of bump electrodes along longitudinal direction T1 is larger than the number of bump electrodes along lateral direction T2. The disposition of bump electrodes 84 forming the bump electrode group is the same as that shown in FIG. 1A, FIG. 8A, FIG. 9A, FIG. 10A or FIG. 11A.

FIGS. 13A to 13E are process diagrams for explaining a method of manufacturing this semiconductor device. Wiring substrate 40 including a plurality of product forming portions 41 disposed in matrix form is first prepared. Each of product forming portion 41 is a portion that forms wiring substrate 40 for semiconductor device 80.

Figure 13A:
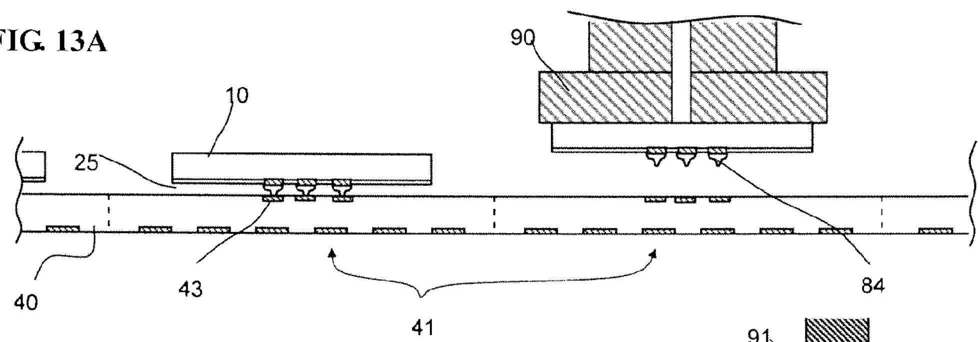
FIG. 13A to 13E are diagrams for explaining the semiconductor device manufacturing method in the sixth exemplary embodiment.

As shown in FIG. 13A, wiring substrate 40 and each semiconductor chip 10 are joined to each other through bump electrodes 84, for example, by using bonding tool 90 so that gap 25 is formed between wiring substrate 40 and semiconductor chip 10. The disposition of bump electrodes 84 is as described above.

Figure 13B:
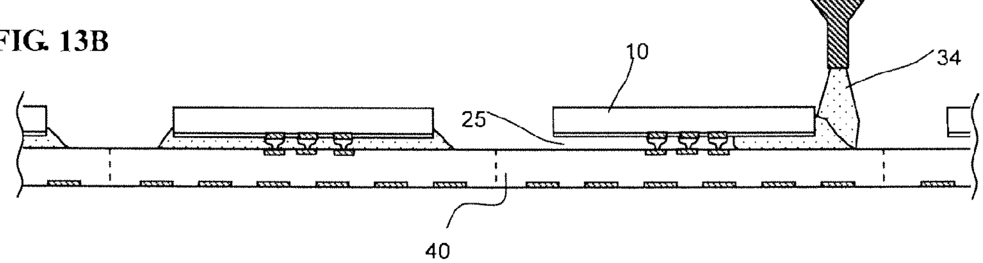

Next, as shown in FIG. 13B, underfill material 34 provided as the mold resin is caused to flow in gap 25 between wiring substrate 40 and each semiconductor chip 10 along lateral direction T2 of the bump electrode group, i.e., the direction in which the smaller number of bump electrodes are arranged. Underfill material 34 is supplied from dispenser 91 to the vicinity of an end side of semiconductor chip 10.

Figure 13C:
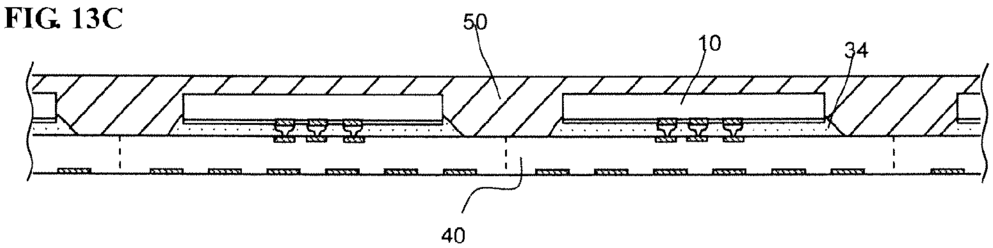
Figure 13D:
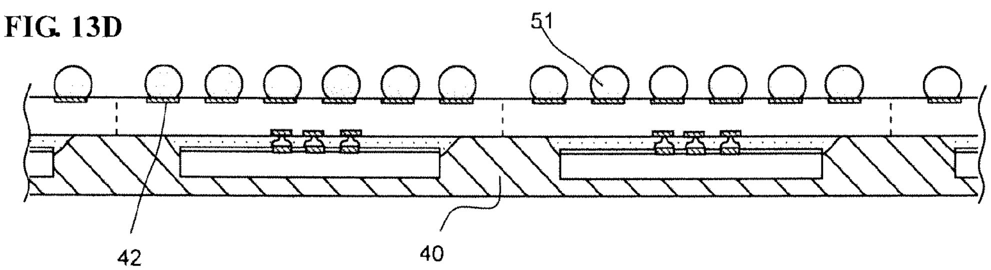
Figure 13E:
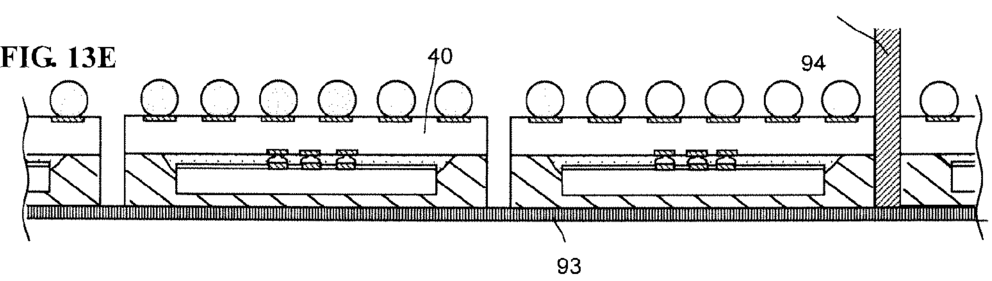

Next, as shown in FIG. 13C, second mold resin 50 is formed on wiring substrate 40 so as to cover semiconductor chips 10 and mold resin 34. Thereafter, as shown in FIG. 13D, metal balls 51 that serve as external terminals are mounted on lands 42 of wiring substrate 40. Then, as shown in FIG. 13E, cutting with dicing blade 94 along predetermined dicing lines is performed to separate each product forming portion 41. After cutting and separating, each product forming portion 41 is picked up from dicing tape 93 to obtain semiconductor device 80 shown in FIG. 12.

In the present exemplary embodiment, underfill material 34 is caused to flow between semiconductor chip 10 and wiring substrate 40. Also in this case, as in the case of the described exemplary embodiments, the occurrence of voids in the gap between semiconductor chip 10 and wiring substrate 40 can be reduced.

The present invention made by the inventor of the present invention has been described with respect to the exemplary embodiments. However, the present invention is not limited to the above-described exemplary embodiments.

For example, while the exemplary embodiments have been described with respect to the case where each bump electrode group includes bump electrodes disposed in a lattice pattern with a 50 μm pitch, the bump electrode group may be formed of bump electrodes disposed in a row.

The above-described manufacturing method can be applied to all methods using processes in which an underfill material is caused to flow not only between semiconductor chips or between a semiconductor chip and a wiring substrate but also between substrates joined to each other through a bump electrode group.

The direction in which the larger number of bump electrodes are arranged (first direction) may be parallel to the longer sides or the shorter sides of the semiconductor chip. The bump electrodes may be disposed in the gap in which the underfill material flows.

While preferred embodiments of the present invention have been described using specific terms, such description is for illustrative purposes only, and it is to be understood that changes and variations may be made without departing from the spirit or scope of the following claims.

What is claimed is:

1. A method comprising:

preparing a first substrate including a first surface and one or more bump groups, each bump group on the first substrate formed of a different array of bumps arrayed with a respective pitch, each bump group having a number of bumps along a same first direction being larger than a number of bumps along a same second direction perpendicular to the first direction, a distance by which the bump groups are spaced apart from each other is larger than the pitch between the bumps forming the bump groups, the one or more bump groups comprising a first bump group formed on the first surface, the first bump group comprises a plurality of first bumps arranged in an array with a certain pitch, a sum of the first bumps in a first line along the first direction is larger than that of the first bumps in a second line along the second direction and differing from the first line; and supplying an insulating resin to the first substrate so that the insulating resin flows from an edge of the first substrate along the second line, wherein the one or more bump groups includes a third bump group, the third bump group comprises a plurality of third bumps arranged in an array with another certain pitch that is larger than the certain pitch, the sum of the third bumps in a fifth line is smaller than that of the third bumps in a sixth line, the fifth line being substantially parallel to the first line, the sixth line being substantially parallel to the second line, and a distance between the first bump group and the third bump group is larger than the certain pitch.

2. A method comprising:

preparing a first semiconductor chip including one or more bump groups, each bump group of the first semiconductor chip formed of a different array of bumps arrayed with a respective pitch, each bump group having a number of bumps along a same first direction being larger than a number of bumps along a same second direction perpendicular to the first direction, a distance by which the bump groups are spaced apart from each other is larger than the pitch between the bumps forming the bump groups, the one or more bump groups comprising a first bump group comprising a plurality of first bumps formed on a first surface, the first bumps arranged in array of columns along the first direction and rows along the second direction with a certain pitch for the first bumps, a number of columns of the first bumps is larger than that of the rows of the first bumps;

preparing a second semiconductor chip including a plurality of second bumps formed on a second surface and a plurality of third bumps formed on a third surface that is opposed to the second surface, the third bumps being electrically coupled to the second bumps, respectively;

stacking the second semiconductor chip over the first surface of the first semiconductor chip so that the second surface faces the first surface, the first bumps being electrically coupled to the second bumps, respectively;

filling an insulating resin into a gap between the first semiconductor chip and the second semiconductor chip so that the insulating resin flows from an edge of the first semiconductor chip along a direction of the rows of the first bumps; and mounting a wiring board over the third surface of the second semiconductor chip, the wiring board including a plurality of connection pads thereof, the third bumps being electrically coupled to the connection pads, respectively, wherein the one or more bump groups includes a second bump group, the second bump group comprises a plurality of fourth bumps arranged in an array of columns and rows with the certain pitch, the number of columns of the fourth bumps is larger than that of the rows of the fourth bumps, and a distance between the first bump group and the second bump group is larger than the certain pitch.

3. The method as claimed in claim 2, wherein the second bump group is spaced apart from the first bump group toward the first direction.

4. The method as claimed in claim 2, wherein the second bump group is separated with a distance from the first bump group toward the second direction.

5. The method as claimed in claim 2, wherein the one or more bump groups includes a third bump group, the third bump group comprises a plurality of fifth bumps arranged in an array of columns and rows with another certain pitch that is larger than the certain pitch, the number of columns of the fifth bumps is smaller than that of the rows of the fifth bumps, and a distance between the first bump group and the third bump group is larger than the certain pitch.

* * * * *